United States Patent [19]

Tuffias et al.

[11] Patent Number: 5,780,157

[45] Date of Patent: Jul. 14, 1998

[54] COMPOSITE STRUCTURE

[75] Inventors: Robert H. Tuffias, Los Angeles; Brian E. Williams, Simi Valley; Richard B. Kaplan, Beverly Hills, all of Calif.

[73] Assignee: Ultramet, Pacoima, Calif.

[21] Appl. No.: 254,515

[22] Filed: Jun. 6, 1994

[51] Int. Cl.⁶ ...................................................... B32B 9/00
[52] U.S. Cl. ........................ 428/408; 428/457; 428/469; 428/472; 428/699; 244/133
[58] Field of Search ....................... 428/408, 688, 428/689, 699, 469, 472, 457, 141, 142; 244/133

[56] References Cited

U.S. PATENT DOCUMENTS

| | | | |
|---|---|---|---|
| 3,895,156 | 7/1975 | Hammond | 428/216 |
| 4,626,476 | 12/1986 | Londry | 428/457 |
| 4,766,013 | 8/1988 | Warren | 427/228 |
| 4,828,934 | 5/1989 | Pinkhasov | 428/622 |
| 4,917,968 | 4/1990 | Tuffias et al. | 428/621 |
| 4,960,640 | 10/1990 | Paquette et al. | 428/368 |
| 5,154,970 | 10/1992 | Kaplan et al. | 428/304.4 |
| 5,236,745 | 8/1993 | Gupta | 427/454 |
| 5,352,484 | 10/1994 | Bernard et al. | 427/228 |
| 5,495,979 | 3/1996 | Sastri | 228/124.1 |

*Primary Examiner*—Timothy Speer
*Attorney, Agent, or Firm*—Bruce A. Jagger

[57] ABSTRACT

A refractory composite structure comprising a ductile refractory metallic layer with a roughened surface which is tightly bonded to a refractory composite structural shell. The roughened surface is dendritic in form and is produced by chemical vapor deposition techniques.

9 Claims, 2 Drawing Sheets

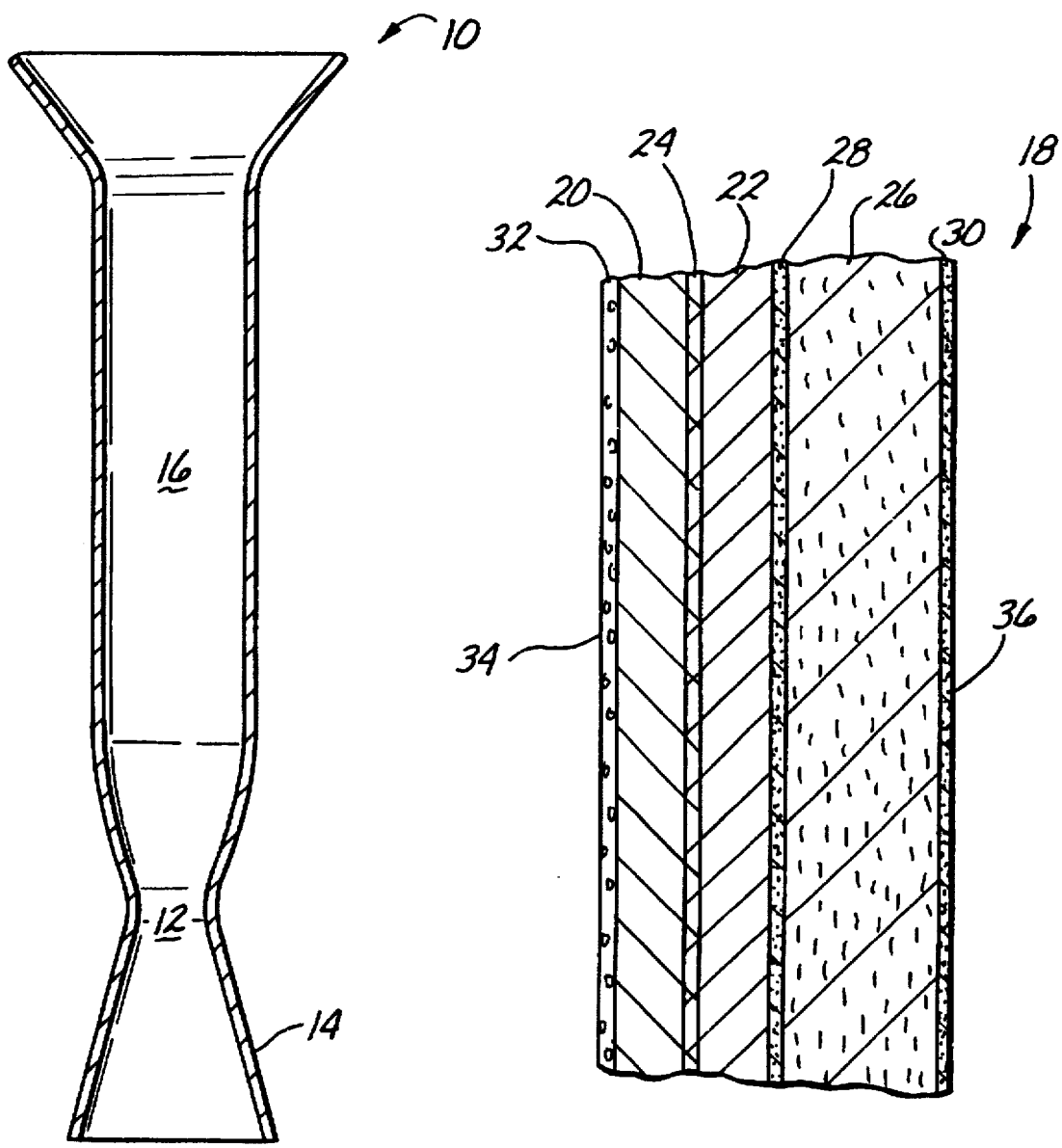

COMPOSITE STRUCTURE

The U.S. Government has a paid-up License in this invention and rights and limited circumstances to require the patent owner to license others on reasonable terms as provided for by the terms of contract number in NAS9-18840 awarded by the National Aeronautics and Space Administration.

BACKGROUND OF THE INVENTION

1. Field of the Invention

This invention relates to high strength, high temperature corrosion and erosion resistant structures and their processes of preparation. More particularly, this invention relates to cost effective, low heat capacity, lightweight composite structures with tailored thermal conductivity which are capable of sustaining heavy loads and withstanding highly corrosive and erosive environments at greatly elevated temperatures and pressures for hours or days or even more.

2. Description of the Prior Art

Previously considerable difficulty had been experienced in providing efficient structures which retain their structural integrity at temperatures in excess of 1,500 degrees centigrade while sustaining substantial structural loads in harsh chemical environments. Previous solutions have included that proposed in Tuffias et al U.S. Pat. No. 4,917,968, wherein a structure composed of metallurgically bonded layers of a platinum group metal such as ductile iridium and a refractory metal such as ductile rhenium possesses both the high temperature corrosion resistance and the high temperature structural strength for high stress, high temperature applications. When additional strength was required, according to previous teachings, it was generally believed necessary to increase the thickness of the structure, particularly the thickness of the refractory metal layer. Increasing the strength of the structure by increasing its thickness increased the weight, the heat capacity, the cost and the difficulty of manufacturing it. These limitations are undesirable in a number of fields including, for example, that of rocketry. Rocket thrust chamber assemblies, for example, could be improved by the availability of lightweight, low cost, high strength, low heat capacity refractory materials. Further, the ability to selectively tailor the strength, heat capacity and thermal conductivity of various parts of the rocket thrust chamber assemblies would permit greater efficiencies and design flexibility.

As described, for example, in Tuffias et al U.S. Pat. No. 4,917,968, chemical vapor deposition procedures are utilized to form successive layers of a structure under conditions such that the layers are bonded together by an interlayer which is an admixture of the two adjacent layers. A first corrosion resistant layer is provided which is capable of withstanding highly corrosive environments at temperatures in excess of 1,500 degrees centigrade, and preferably, in excess of 2,000 or 2,200 degrees centigrade. The corrosion resistant layer is bonded through an interlayer to a high strength layer. The high strength layer exhibits tensile strengths in excess of 5,000, and preferably, 15,000 pounds per square inch at temperatures in excess of 1,500, and preferably, in excess of 2,000 degrees centigrade. In general, the metallic layers in such structures are composed of platinum group metals such as, for example, iridium, and refractory materials, preferably metals such as, for example, rhenium. The hot sides or normally interior sides of the structures may, if desired, be coated with high temperature ceramic materials such as, for example, hafnium dioxide or zirconium dioxide, to improve their corrosion resistance.

When rocket thrusters are operated at the optimum oxidizer/fuel ratio, the temperature of the combustion products may be as high as 2,000 to 3,000 degrees centigrade. This is the condition at which the highest efficiency is achieved. Thrusters must be cycled on and off many times over their useful lives. The thrusters may cool between cycles to very low temperatures. Further, thrusters must withstand the forces imposed on space vehicles during launch and in use. The materials from which thrusters are constructed must withstand both structural and thermal shock. Brittle materials tend to fail rapidly because of an inability to withstand this shock. Premature failure because of cracking under shock or thermochemical failure greatly limits the useful life and reliability of the thruster. Very few materials or material combinations are capable of withstanding the shock loads, the structural loads, and the catastrophically corrosive conditions which are imposed on, for example, a rocket thrust chamber assembly. The metallurgically bonded Iridium-Rhenium structure described in Tuffias et al U. S. Pat. No. 4,917,968 is capable of fulfilling these requirements except that increasing the mass of the structure to accommodate particularly robust applications produces some undesired results.

Increasing the volume of the metallic parts of the rocket motor in an attempt to increase strength and durability is generally self defeating. The cost of operating a spacecraft with heavier components escalates rapidly, and efficiency degenerates rapidly to unacceptable levels. The cost and difficulty of manufacturing high quality parts escalates quickly as the volume and weight of metal increases, particularly where the structure has a high degree of concavity. When operating out of the atmosphere, rocket motors are cooled by radiation. Under these conditions high heat capacity structures are undesirable because the heat retained in the structure of the rocket motor flows back into the adjacent structures and electronics, including the fuel system components, especially during shut down. This may cause the fuel system or other components to fail or, at the worst, it may cause the fuel to ignite outside of the rocket motor chamber with catastrophic results. In general, the heat in the rocket motor should be dissipated from the skirt region by radiation. Preferably, thermal conductivity between the skirt region and the rest of the rocket motor should be enhanced. These objectives are generally incompatible with increasing the strength of the motor by increasing the thickness of its refractory metal walls.

Propulsion systems incorporating thrust chamber assemblies are used in space for the maneuvering of satellites and otherwise, in air for aircraft intercept systems, ground based intercept systems, and the like. Improving the efficiency of the thruster and extending its life provides a substantial number of new alternatives in these and other applications. The same thrust can be obtained with less fuel and thus less weight. The savings in weight can be distributed between additional fuel and additional payload. Extending the life of the thruster and the number of cycles which it can withstand prolongs the useful life of the satellite or vehicle upon which it is mounted. Increasing the effective fuel capacity of the vehicle also extends its useful life.

Many applications exist outside of the space field for lightweight, relatively inexpensive structures which are capable of withstanding shock, and high structural loads in highly corrosive high temperature environments. The absence of such structures limits or precludes the use of some reactions in the chemical process industry. Such structures find application in propulsion systems and prime movers other than rockets. Other fields such as nuclear, metallurgical, waste disposal, emissions reduction, and the like, also require such structures to optimize or make possible various operations.

Chemical vapor deposition procedures are known and have been used for the better part of a century for forming various coatings. In general it is a method of plating on an atom by atom basis in which a gaseous compound, or compounds, of the material to be deposited is flowed over or through a heated substrate, resulting in the thermal decomposition or reduction of the compounds and the subsequent deposition of the material onto an exterior or interior surface of the heated substrate. The parameters which must be controlled for successful reliable operation include the choice of gaseous compounds, the concentration of the compounds in the gas, the gas flow rate, the gas pressure, the nature of the substrate material, the geometry of the substrate, the temperature of the substrate, and the geometry of the reaction chamber. The nature of the deposit may be controlled by controlling these parameters. The crystal form may, for example, sometimes be changed by changing the gaseous compounds. The degree of adherence to the substrate may be controlled, for example, by adjusting the temperature of the substrate. The deposits formed by chemical vapor deposition are generally very pure. Materials may be codeposited depending upon the composition of the gas which is supplied to the reactor. Both metallic and non-metallic materials may be deposited using these techniques and they may even be codeposited. In general, the preferred method of construction of hollow structures is that whereby successive layers are formed on a mandrel which is later removed, for example, by chemical leaching. The structure is thus formed inside out, thereby reflecting the outer surface of the mandrel.

For the sake of convenience in describing and defining the process and the structure, the cross-section of the structure has been referred to as comprising various layers of materials. If desired, however, it is possible with chemical vapor deposition techniques to provide a continuous variation in the composition of the structure from one pure material at one outer surface to another pure material at the opposed outer surface. Also, the variation in the composition need not be continuous. If ceramics are used on one outer surface it is possible to provide such a continuous variation in composition across three or more materials, not all of which are metallic. Such graded deposits have no discontinuity and thus no stress concentration due to a mismatch of thermal expansion rates. Graded deposits are produced by varying the composition of the reactive gas as the deposit builds up. The description and definition of the process and structure is intended to include such graded deposits.

In general the chemical vapor deposition operation which is utilized to form the structure is controlled so that the first deposit is not necessarily chemically or metallurgically bonded to the mandrel. Subsequent deposits are bonded very tightly to one another through interlayers. Adjustment of the temperature of the substrate and the period of time during which the substrate is subjected to elevated temperatures permit control of the extent and nature of the bond. The preferred temperatures should be determined for each specific situation, and may vary considerably from one application to another.

Less preferred alternative coating methods may be used, if desired, in the formation of part or all of the structures described. Such methods include, but are not limited to, for example, electrolytic, electroless, physical vapor deposition (PVD), plasma spray techniques, and the like.

The requirement that the structure be possessed of shock resistance and high strength at very high temperatures severely limits the choice of refractory materials for the high strength barrier or layer. Materials which have tensile strengths in excess of 5,000 pounds per square inch at 2,000 degrees centigrade include, for example, carbon-carbon, tungsten, Ta-10W, Mo-50Re, rhenium, and thoriated tungsten (W-1ThO$_2$). Of these materials, only carbon-carbon, W-1ThO$_2$, rhenium and Mo-50Re have tensile strengths approximately in excess of 10,000 pounds per square inch at 2,000 degrees centigrade. Alloys, admixtures, and composites of these materials with each other and with other materials are also suitable for use as the structural barrier.

The requirement that the corrosion resistant layer or barrier withstand shock and catastrophically corrosive conditions at temperatures in excess of 1,500 and preferably in excess of 2,000 or 2,200 degrees centigrade for several hours severely limits the choice of materials for this layer or barrier. The platinum group metals and their alloys are candidates for this barrier. Iridium and rhodium and their alloys with each other and with, for example, platinum, rhenium and osmium, are suitable candidates. The addition, for example, of approximately 30 percent platinum or rhodium to iridium reduces the melting point of the alloy to approximately 2,200 degrees centigrade but substantially increases the resistance of the material to oxidation.

Iridium structures, and certain iridium alloy structures, which have been carefully prepared by chemical vapor deposition procedures are inherently ductile. This permits the structural layer to deform somewhat under applied loads without destroying the integrity of the corrosion barrier.

Where it is desired to protect exposed surfaces of the structure, and particularly the exposed surface of the corrosion barrier, with a ceramic material there are a number of possible suitable materials. Hafnium dioxide and zirconium dioxide are very suitable, particularly when stabilized with an inversion inhibitor. Yttria, for example, has been used to inhibit the crystalline inversion of hafnium dioxide. Crystalline inversion occurs with hafnium dioxide at approximately 1,600 degrees centigrade and causes cracking and spalling of hafnia coatings. Other borides, carbides and nitrides from which suitable materials may be selected include, for example, hafnium, tantalum, zirconium, tungsten, silicon, and boron carbides, tantalum, hafnium, boron, zirconium, titanium, and niobium nitrides, and hafnium, zirconium, tantalum, niobium, and titanium borides. The ceramic layer, if used, is very thin and is not intended to provide the primary corrosion protection for the structural layer. The purpose of the ceramic barrier is to reduce the recession rate of the primary corrosion barrier. The ceramic and/or primary corrosion barrier may be applied to all of the exposed surfaces of the structure if desired. The thickness of the ceramic layer is generally three mils or less. This may be varied as conditions may require.

Carbon fiber reinforced carbon matrix composites are known to be lightweight, high strength, refractory, structural materials whose strength increases with temperature, even at temperatures well in excess of 2,000 degrees Centigrade. Well known limitations on the use of carbon-carbon composites include the facts that they rapidly oxidize catastrophically at temperatures well below 1,000 degrees Centigrade, and generally exhibit some degree of porosity. These composites must, therefore, be protected from oxidation, and are generally not satisfactory where an impermeable structure is required. In the preparation of carbon-carbon composite structures, the carbon fibers and filaments are generally formed into a construct or preform of the desired configuration by winding, weaving, knitting, braiding, or wrapping over a suitably formed support or mandrel. The carbon matrix is generally formed by infiltrating the preform with resin, which is then pyrolyzed, or by chemical vapor deposition techniques, or both, whereby carbon is deposited in the construct. The characteristics of the completed composite are determined by the nature of the starting materials and the processing. The thermal and mechanical properties of carbon-carbon composites are highly tailorable.

BRIEF SUMMARY OF THE INVENTION

A preferred embodiment of the high strength, high temperature corrosion resistant composite structures according to the present invention comprises a layer of refractory metal tightly bonded to a normally outer low density, high strength refractory structural composite shell comprising a matrix and filamentaceous inclusions. The structural composite shell may comprise, for example, carbon-carbon or other composite materials. Preferably, the metallic portion of the structure comprises thin, ductile, metallurgically bonded layers of platinum group metal and refractory metal. Both the platinum group metal and the refractory metal may be alloys, if desired. Physical bonding of the refractory metal to the composite is generally facilitated by the provision of a roughened surface on the refractory metal. Preferably, the roughened surface is formed by a dendritic growth of the refractory metal.

The terms "platinum group metal" and "noble metal" as used herein will be understood by those skilled in the art to refer to and include a wide variety of metallic alloys, solid solutions, and the like, which are useful in high temperature environments, including, for example, iridium and iridium-platinum alloys. The term "refractory metal" as used herein will be understood by those skilled in the art to refer to and include a wide variety of metallic alloys, solid solutions, and the like, which are useful in high temperature environments, including, for example, rhenium. The term "carbon-composite" as used herein will be understood by those skilled in the art to refer to and include a wide variety of matrix materials which are useful in high temperature environments, including, for example, carbon, metal diborides, metal carbides and combinations thereof. These same materials, in the form of fibers, may be effectively used as the reinforcement phase of the composite.

In general, the composite structure is designed so that the platinum group metal is exposed to the high temperature, high pressure environment, such as, for example, the inside of a rocket motor combustion chamber. The known capability of the noble metal to withstand chemical and erosion attack at temperatures in excess of 1500 degrees Centigrade is utilized to protect the load bearing elements of the structure. The strength to withstand very high structural loads at very high temperatures is provided by the refractory metal layer and a tightly bonded lightweight layer or shell of carbon-composite material.

The refractory metal layer is only massive enough to prevent migration of the hot gases, to absorb thermal shock and thermal stress, and to allow the flow of heat to the skirt area for dissipation by radiation. The mass and thickness of the refractory metal layer is thus minimized to just that which is necessary to perform these functions. In order to optimize the structure it is designed so that the metallurgically bonded metallic layers do not by themselves have sufficient strength to withstand the maximum design loads. Insofar as possible, the required strength, in excess of that which is inherent in the thusly minimized refractory metal layer, is provided by the carbon-composite load bearing shell. In general, for a generally circular configuration, from approximately 50 to 90, and preferably from about 70 to 90, percent of the hoop strength of the composite structure at 2,000 degrees centigrade is provided by the carbon-composite shell. In general, such a circular structure is capable of exhibiting hoop strengths in excess of 25,000 pounds per square inch at 2,000 degrees centigrade with a wall thickness of no more than approximately 0.100 inches. The flow of heat is also controlled in significant part by the nature and construction of the load bearing carbon-composite shell.

Preferably, in, for example, rocket thrust chamber applications, the exposed side of the platinum group metal is protected by a thin oxide, ceramic or metal layer, for example, hafnium or zirconium dioxide, or iridium aluminide.

In applications where the protection of the noble metal layer is not needed it may be eliminated without impairing the functions performed by other components of the structure.

The interface between the refractory metal and the load bearing carbon-composite, may, if desired, include a diffusion barrier which serves to protect the refractory metal and the carbon-composite from reaction with one another, or to control heat transfer or thermal expansion match between the two. The carbon-composite is preferably, although not necessarily, rendered as non-porous and oxidation resistant as possible, for example, by the application of an exterior coating, so as to minimize the exposure of the refractory metal to the exterior ambient environment and to protect the carbon-composite.

The high strength low density load bearing composite shell is preferably a carbon-carbon composite in which the matrix is a carbon. Depending on the physical configuration, particularly of the preform, and the materials used, it is possible to control to a very substantial degree the heat capacity and the flow of heat through the load bearing composite shell. Thus, heat can be conducted preferentially away from the fuel injectors and support structure, and into the skirt of the rocket motor for dissipation by radiation. The carbon-carbon composite shell can be tailored so that it substantially thermally insulates the fuel injectors and motor mounts. The metallic part of the structure, and particularly, for example, high stress areas such as the throat of a rocket motor, can be selectively strengthened by the carbon-carbon composite shell so as to withstand the very substantial vibration loads which occur, for example, at liftoff, without suffering any substantial weight penalty. Thus, the individual elements in the overall metal/carbon-carbon composite structure are specifically tailored and combined so that strength, weight, corrosion resistance and thermal control are all optimized in a relatively inexpensive structure. The resulting composite structure such as, for example, a rocket motor, can be reliably and repeatedly used at operating temperatures in excess of 1,500 or even 2,200 degrees Centigrade for at least 10 to 20 hours or more, and through several hundred cycles from ambient to operating temperatures. This composite structure is particularly suited for use where it is formed, for example, into a rocket motor which is to be cooled by radiation only.

The quantity of metal required in the bimetal noble metal-refractory metal liner or inner shell is minimized. Material costs are thus minimized and scarce resources are conserved. Where chemical vapor deposition procedures are utilized in the formation of the bimetal liner, the deposition time is also minimized. Costs of fabrication are thus minimized. Operating costs for flight vehicles are minimized because the metal/carbon-composite structure is considerably lighter than a comparable all metal structure. The flow of heat through the structure is controlled.

The diffusion barrier, when present, is conveniently composed of, for example, hafnium carbide, hafnium boride, tantalum carbide, mixtures of these, and the like. These materials may be deposited to form a diffusion barrier, for example, by chemical vapor deposition techniques. It has been found that at operating temperatures in excess of approximately 2,400 degrees Centigrade, carbon interacts catastrophically with the unprotected refractory metal. The eutectic point of, for example, carbon and rhenium mixtures is slightly below 2,500 degrees Centigrade. The presence of an effective diffusion barrier is essential at operating temperatures in excess of approximately 2,400 degrees Centigrade.

Whether bonded directly to the refractory metal or through a diffusion barrier, the carbon-composite must be adhered tightly to the substrate. Adhesion is preferably enhanced by forming a roughened surface on the substrate. Such a roughened surface is conveniently formed, for example, by altering the conditions in the last phase of the chemical vapor deposition process by which the refractory metal layer or diffusion barrier is formed. The resultant roughened surface has much more surface area and considerably greater mechanical interlocking than a smooth surface. Both bonding and heat transfer are thus enhanced. The surface roughness, measured from the mean surface of the structure, should be at least approximately 1 micron, and preferably at least approximately 3 microns, and may be as much as approximately 10 or 20 microns or even more. Preferably, the roughness is caused by closely spaced but generally isolated free standing elongated grains of metal which extend generally perpendicular to the plane of the deposit. The deposit of such free standing grains is generally dendritic in form. Satisfactory results may be realized by utilizing roughened surfaces in which there appear from approximately 500,000 to 15,000,000, and preferably from approximately 2,000,000 to 10,000,000, free standing grains per square centimeter. In general, most of the dendritic grains are touching at their bases and taper outwardly away from the surface of the structure. In general the elongated grains have an average grain diameter of from approximately 1 to 10 or 20 microns and preferably from approximately 3 to 10 microns, and an average grain length of from approximately 1 to 30 microns, and preferably from approximately 3 to 25 microns. In general, the grain size and roughness are larger for lower densities of grains per square centimeter. Thus, at a density of approximately 2,000,000 grains per square centimeter the grains generally range in length from approximately 7 to 21 microns with an average diameter for the tapered dendrites of approximately 7 microns. The roughness of such a surface generally ranges from approximately 3 to 11 microns. For a density of approximately 10,000,000 grains per square centimeter the grains generally range in length from approximately 3 to 9 microns with an average diameter for the tapered dendrites of approximately 3 microns. The roughness of such a surface generally ranges from approximately 1 to 5 microns.

The carbon-composite generally has a coefficient of linear thermal expansion which is less than that of the metallic part of the composite structure. Where the overall composite structure has, for example, a generally circular cross-section with the carbon-composite layer on the outside, the differential thermal expansion rates tend to force the refractory layer strongly against the carbon-composite as the structure is heated above ambient temperatures.

The preferred carbon-carbon composite shell is generally formed by first preparing a preform or construct of carbon fibers which is subsequently infiltrated by, for example, a carbon matrix precursor, such as, for example, a resin. The precursor is then pyrolyzed to carbon. Alternatively or in conjunction with a resin, chemical vapor deposition techniques may be utilized, if desired, to deposit carbon into the interstices of the preform.

Constructs or preforms in which the fibers are substantially continuous are generally preferred. The carbon fibers may be provided, for example, in the form of monofilaments, tows, tapes, woven cloth, or the like. The carbon matrix precursor and the conditions of pyrolysis may be selected so that the matrix is highly graphitized, if desired. In general, the matrix is carbon.

The preform may be constructed by braiding or filament winding or a combination of these. The carbon-carbon load bearing composite shell may be constructed on a prefabricated noble metal-refractory metal liner, from the inside out. During fabrication the composite structure is preferably exposed to temperatures which are in excess of those to which it will be subjected during use.

The thermal conductivity of a carbon-carbon composite may be as much as 6 or 7 times as great in the warp and fill directions as it is across ply, at the desired operating temperatures. These anisotropic thermal conductivity characteristics of the composite may be utilized to preferentially convey heat between particular locations, for example, from the throat region to the skirt area of a rocket engine combustion chamber.

The carbon-carbon load bearing composite shell may, if desired, be protected from oxidation by the application of a high temperature oxidation resistant coating on the normally outer surface of the shell. The oxidation resistant coating also serves to reduce or eliminate the porosity of the carbon-carbon composite. Such a coating may comprise, for example, in situ formed silicon carbide or silicon nitride or thin alternating layers of hafnium carbide or zirconium carbide and silicon carbide. A multilayered structure provides increased thermal and mechanical shock resistance and a tailored thermochemical stability. Hafnium diboride or zirconium diboride layers may, for example, also be included in the coating for better oxidation resistance, particularly at temperatures around or above 1800 degrees centigrade. Hafnium and zirconium are Group IVb metals which have melting points in excess of about 1850 degrees centigrade. Each of the thin alternating layers is generally no more than a few microns thick, preferably from approximately 1 to 10 microns with a total thickness for the coating of from approximately 5 to 30 mils. When thin layers are used the outermost layer which is exposed to the surrounding environment is preferably silicon carbide. The first layer of the coating forms an interlayer between the coating and the substrate. The interlayer is generally preferably silicon carbide, but may be a different material. This interlayer between the carbon-carbon composite and the normally outer oxidation resistant coating is generally thicker than the other layers so as to accommodate some irregularities in the surface of the substrate. The multilayer oxidation resistant coating is preferably applied to the normally outer surface of the carbon-carbon load bearing composite by chemical vapor deposition techniques, although other techniques, such as, for example, physical vapor deposition or pack cementation, may be used if desired.

Alternatively, ceramic materials may be deposited into the preform to form a ceramic matrix or a mixed carbon-ceramic matrix for the composite structural shells. Such ceramic materials include, for example, zirconium diboride, silicon carbide, hafnium carbide and combinations of diborides and carbides. Such ceramic matrices may be formed by, for example, chemical vapor deposition, liquid infiltration of the preform and pyrolysis, pressed and sintered powders, or combinations of these methods. The density of the ceramic containing composite structural shells is generally comparable to that of the carbon-carbon composite structural shells. Regardless of the nature of the composite structural shells it is necessary that they be tightly bonded, directly or through a diffusion barrier, to the metallic layer. The roughening of the bonding surface of the metallic layer is provided regardless of the nature of the composite structural shell.

Composite structures according to the present invention find application in a variety of areas including, for example, rocket engine combustion chambers, heat pipes, industrial hazardous waste disposal, emissions control, actively cooled carbon-carbon composites, and the like.

BRIEF DESCRIPTION OF THE DRAWINGS

Referring particularly to the drawings for the purposes of illustration and not limitation:

FIG. 1 is a schematic cross-sectional view of a rocket combustion chamber.

FIG. 2 is an enlarged cross-sectional view of a wall of a composite structure according to the present invention.

DETAILED DESCRIPTION OF THE PREFERRED EMBODIMENTS

Figure 3:
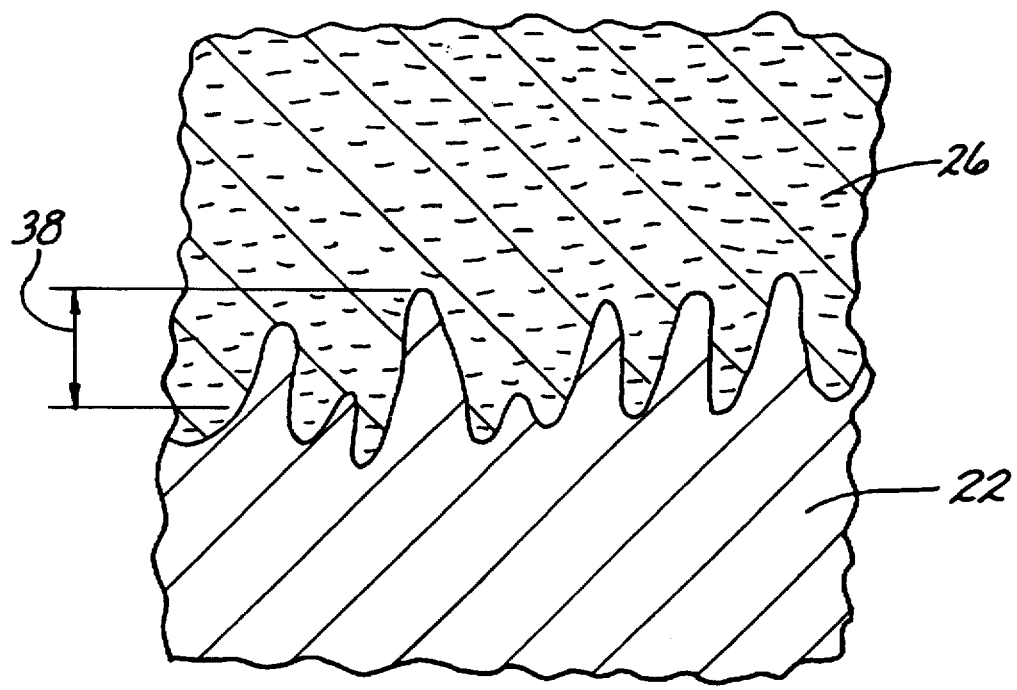
FIG. 3 is an enlarged cross-sectional view of a portion of the interface between metallic and composite elements of a wall according to the present invention.

Referring particularly to the drawings for the purposes of illustration and not limitation, there is illustrated diagrammatically at 10, a rocket combustion chamber, including a throat region 12, a skirt 14, and a combustion region 16.

In the preferred embodiment referred to for purposes of illustration, a cross-section of a composite structure according to the present invention is illustrated generally at 18. Composite structure 18 finds particular application in forming the wall of, for example, rocket combustion chamber 10. Composite structure 18 includes a noble metal layer, for example, iridium, at 20, and a refractory metal layer, for example, rhenium, at 22. The noble and refractory metal layers 20 and 22 are bonded metallurgically through an interface layer 24. Interface layer 24 is composed of a mixture of the metals which form layers 20 and 22, with the composition of layer 24 grading from one metal to a mixture of the metals to the other metal without sharp transitions in composition. A lightweight high strength load bearing layer composed of, for example, a carbon-carbon composite, is at 26. An optional diffusion layer 28, composed of, for example, hafnium carbide, tantalum carbide, mixtures thereof, or the like, serves to protect the refractory metal layer 22 and the load bearing layer 26 from each other at very high temperatures. If desired an optional oxidation resistant coating 30 composed of, for example, silicon carbide, silicon nitride or hafnium carbide-silicon carbide, combinations thereof, mixtures thereof, and the like, may be applied to the exterior of the load bearing layer 26. Where the structural composite is to be used in an oxidizing environment, an oxidation resistant coating 30 should be employed. An optional corrosion resistant layer 32 composed of, for example, iridium aluminide, hafnia, zirconia, mixtures thereof, or the like, may, if desired, be applied to the exposed surface of the noble metal layer 20. Alternatively, the layer 20 may be composed primarily or even entirely of iridium aluminide or other oxidation resistant compounds.

In the preferred embodiment which has been selected for purposes of illustration the composite structure is arranged so that side 34 is directly exposed to the heat source and side 36 is the cold side. All of the layers are very tightly bonded to one another. In general the load bearing layer 26 has a linear coefficient of thermal expansion which is less than that of the bimetal layers 20, 22 and 24, so that elevated temperatures in, for example, combustion chamber 10, tend to cause the bimetal layers 20, 22 and 24 to bear more tightly against the load bearing layer 26. The load bearing layer 26 may be configured with different thickness and construction as may be dictated by strength and thermal requirements of a particular application. For example, the load bearing layer 26 may generally be thicker in the throat region 12 than on the skirt 14 of combustion chamber 10, because the loads, particularly those induced by vibration and pressure, are generally greater in the throat region. In general the load bearing layer 26 comprises the majority of the wall thickness of the composite structure. For rocket combustion chamber throat diameters of, for example, approximately 1 inch or less the thickness of the noble metal layer 20 may be held to less than approximately 0.004, and preferably from about 0.0015 to 0.0025 inches, in thickness. The presence of load bearing layer 26 permits the thickness of the refractory metal layer 22 to be held to less than approximately 0.040 inches, and preferably from about 0.020 to 0.010 inches, in thickness. Without load bearing layer 26 the thickness of refractory metal layer 22 might have to be on the order of at least 0.040, and probably 0.100 or more, inches thick, at least in the throat region 12. When the metal layers are formed by chemical vapor deposition it is very difficult to form a structurally sound thick layer of refractory metal in the highly arcuate throat region 12. Load bearing layer 26 may be from 0.050 to 0.100 inches thick. After being formed the load bearing layer 26 may be machined to precise dimensions if desired. When the load bearing layer 26 is bonded directly to the refractory metal layer 22 the presence of a roughened surface on layer 22 promotes mechanical adhesion and increases the surface area which is available for bonding. The roughness of the surface of layer 22 is indicated generally at 38. The interlayer 28 may be similarly deposited with a roughened surface to promote adhesion with the load bearing layer 26.

Rocket engine combustion chambers were constructed according to the present invention. Molybdenum mandrels were formed to the inside configurations of the combustion chambers. The inner diameter of the throat region was about 0.375 inches, the inner diameter of the chamber was about 0.75 inches and the overall length was about 3.5 inches. The combustion chambers were constructed inside out, that is the innermost iridium layer was deposited first on the mandrels. After the combustion chambers were fully formed the mandrels were chemically removed. Larger and small combustion chambers may be constructed, if desired.

The bare mandrel was placed in a chemical vapor deposition apparatus on a rotating work holder inside a closed reaction chamber. The mandrel was heated by an induction heating coil. The air was purged from the reaction chamber and the pressure was reduced to about 20 torr. Iridium acetylacetonate was heated to about 250 degrees centigrade to vaporize it. The mandrel was maintained by induction heating at a temperature of about 500 degrees centigrade for 2 hours. The iridium acetylacetonate vapor flowed over the mandrel and was thermally decomposed upon contact with the hot mandrel surface. At this mandrel temperature the iridium metal did not adhere tightly to the mandrel, thus facilitating the ultimate removal of the mandrel. When the iridium deposit on the mandrel reached a thickness of about 0.0005 inches the deposition of iridium was terminated. The mandrel was then placed in a second chamber and the flow of rhenium pentachloride was commenced. The temperature of the mandrel was about 1300 degrees centigrade and the pressure was about 20 torr. The metallurgical bond between the iridium and rhenium was formed by diffusion between the iridium and the rhenium. The metallurgical bond was only a few microns thick. Rhenium pentachloride was formed by heating a mass of rhenium metal in a chlorination chamber while flowing chlorine gas over it. The chlorination chamber was heated by a resistance heater. The chlorination chamber was inside the reaction chamber. The rhenium metal was heated to a temperature of about 600 degrees centigrade. Chlorine gas was flowed over the rhenium metal in the chlorination chamber, at the rate of 300 cubic centimeters per minute. The resultant rhenium pentachloride gas was mixed with argon flowing at a rate of about 100 cubic centimeters per minute, and this gaseous admixture was flowed over the rotating mandrel at a pressure of 20 torr. The mandrel was maintained at a temperature of about 1300 degrees centigrade and the flow of the gaseous mixture was continued for about 30 minutes. The rhenium pentachloride was thermally decomposed at the hot surface of the mandrel to form a rhenium metal deposit on the iridium layer which was already on the mandrel. The rhenium deposition was discontinued when the rhenium deposit reached a thickness of about 0.005 inches. Just prior to the conclusion of the rhenium deposition phase the temperature was changed to about 1000 degrees centigrade so as to cause the formation of an irregular or roughened dendritic like deposit of rhenium on the surface of the rhenium layer. In the resulting deposit the grains of rhenium were present on the surface in a density of from about 7,000,000 to 10,000,000 million grains per square centimeter. Microscopic examination of the rough rhenium surface indicates that it comprises multifaceted, pointed grains of dendritic form extending generally perpendicular to the plane of the coating with an average grain size of approximately 3 microns and a surface roughness of approximately 6 microns. The surface has a fur like appearance. Care is taken in handling the structure so as not to crush the grains and thus decrease the roughness and change the character of the surface. This process was repeated twice more with 2 more specimens. These were prepared using comparable times and conditions except that in the first instance the rhenium deposition was continued for about 60 minutes to form a rhenium deposit 0.010 inches thick, and in the last instance the rhenium deposition was continued for about 120 minutes to form a rhenium deposit 0.020 inches thick.

Two cylindrical molybdenum mandrels were formed, each 6 inches long and 0.75 inches in diameter. These two cylindrical mandrels were coated with 0.020 inch thick coatings of rhenium, according to the above described procedure, over which a 0.100 inches thick carbon-carbon composite layer was formed. These specimens were used for thermal cycling and cross-sectional analysis to determine the performance of the rhenium to carbon-carbon interface.

Carbon-carbon composite structural shells were applied over the iridium-rhenium shells or thrust chamber liners before the mandrels were removed. The carbon-carbon layer applied to the 0.020 inches thick iridium-rhenium shell was nominally 0.100 inches thick, and those applied to the 0.005 and 0.010 inches thick iridium-rhenium shells were nominally 0.050 inches thick. The 0.100 inches thick carbon-carbon structural shell was formed by applying 8 layers of 3 k carbon fiber braid over the iridium-rhenium shell which was then heat stabilized at about 1705 degrees centigrade for 1 hour. Care was taken to avoid crushing the roughened rhenium surface. The preform was impregnated with phenolic resin which was cured and then pyrolyzed at about 815 degrees centigrade. The resulting porous composite was then reimpregnated, recured and repyrolyzed through 4 more densification cycles. The resulting carbon-carbon structural shell had a density of about 1.6 grams per cubic centimeter.

The mandrels were chemically removed from the specimens. The thermal stability and durability of the rhenium to carbon-carbon interface was tested by inductively heating one of the cylindrical tube specimens in an inert atmosphere of argon at a pressure of 0.8 atmospheres. The 0.020 inch rhenium to 0.100 inch carbon-carbon tube structure was heated to approximately 1600 degrees centigrade at a rate of from 350 to 400 degrees centigrade per second. The specimen was held at approximately 1600 degrees centigrade, as measured by an optical pyrometer, for about 5 seconds. The specimen was allowed to cool to about approximately 600 degrees centigrade and was then cycled again to approximately 1600 degrees centigrade. The duration of each cycle was about 25 seconds. The different conductivity of the carbon-carbon composite and the metal caused substantial cyclic thermal stress. The cycling was accomplished by on-off pulsing of the power to the induction heater. After 10 cycles the specimen was allowed to cool to approximately 400 degrees centigrade and a visual inspection was conducted. No visible changes were evident. The thermal cycling was resumed and conducted for a total of 100 cycles for a total testing time of about 42 minutes during which the specimen was at approximately 1600 degrees centigrade for about 8.5 minutes. The specimen showed a weight loss of 0.24 percent.

Microscopic metallographic analysis of a cross-section of the thermally tested specimen showed that the rhenium to carbon-carbon interface appeared substantially the same as that in the specimen which had not been subjected to the thermal stress test. The rough rhenium surface was fully infiltrated by the carbon matrix and carbon fibers. No dimensional changes or delamination were visible.

The carbon-carbon composite was peeled apart from the roughened rhenium surface of a thermally tested specimen. The carbon-carbon composite failed between the plies in the composite and not at the roughened interface with the rhenium. A portion of the carbon-carbon composite remained well adhered to the roughened rhenium surface. The peel strength of the bond between the rhenium and the carbon-carbon composite thus exceeds the interlaminar peel strength within the carbon-carbon composite. Similar peel strength relationships may be achieved with other matrix materials and preforms.

The hoop strength of the composite structure was found to vary from approximately 20,000 to 35,000 pounds per square inch using T-300 carbon fiber in a two dimensional preform and a carbon matrix.

The carbon fiber can be applied to a mandrel by winding, braiding, wrapping with fabric, by a combination of these, or by any other method which permits control of the direction of the fibers. The thermal conductivity of carbon fibers varies widely from approximately 10 to 150 watts per meter kelvin, or even more. Thus, by controlling the direction, thermal conductivity and quantity of the carbon fibers in the preform it is possible to control the flow of heat through the composite.

Various matrix materials can be combined with fiber preforms by, for example, liquid or gas phase impregnation. A preform may be impregnated, for example, with a liquid resin or other material which contains the desired ceramic matrix precursor, followed by pyrolysis to form the desired ceramic matrix. Alternatively, a ceramic coating may be formed on the individual fibers in the preform by infiltrating the preform with gas phase compounds which through reduction and/or thermal decomposition yield the desired ceramic coating. Further metals or ceramics may be melted into the fiber preform, during which the molten material is wicked into the fiber preform. The benefits of a strong interface between the rhenium and the composite are enjoyed by all of these composite materials.

Where the extra benefits provided by the iridium are not required, repetition of the above procedures produces very strong and durable rhenium-composite structures wherein there is a very strong interface between the rhenium and the composite.

What has been described are preferred embodiments in which modifications and changes may be made without departing from the spirit and scope of the accompanying claims.

What is claimed is:

1. A high temperature corrosion resistant composite structure comprising:

a refractory metallic layer having two sides, one of said sides having a roughened surface, said roughened surface comprising from approximately 500,000 to 15,000,000 free standing metallic grains per square centimeter; and a refractory structural composite shell comprising a matrix and filamentaceous inclusions tightly bonded to said roughened surface.

2. A rocket combustion chamber comprising:

a refractory metallic layer having two sides, one of said sides having a roughened surface with a surface roughness of from approximately 1 to 20 microns, the roughness of said roughened surface comprising free standing particles having an average diameter of from approximately 1 to 20 microns; and a refractory structural composite shell comprising a matrix and filamentaceous inclusions tightly bonded to said roughened surface, said refractory metallic layer being adapted to protect said refractory structural composite shell from combustion products.

3. A rocket combustion chamber of claim 2 wherein said matrix comprises a ceramic material.

4. A rocket combustion chamber of claim 2 wherein said chamber has a generally circular cross section and exhibits a hoop strength, and from approximately 50 to 90 percent of said hoop strength being provided by said refractory structural composite shell.

5. A high temperature corrosion resistant composite structure comprising:

a layer of ductile refractory metal having two sides and a tensile strength of greater than approximately 5,000 pounds per square inch at a temperature of approximately 1,500 degrees centigrade, a face of said layer on one of said sides having a roughness of from approximately 1 to 20 microns; and a structural carbon-composite shell comprising a matrix and filamentaceous inclusions tightly bonded to said face of said layer, said layer of ductile refractory metal being adapted to protect said structural carbon-composite shell.

6. A high temperature corrosion resistant composite structure comprising:

a layer of ductile refractory metal having radially inner and radially outer sides and a tensile strength of greater than approximately 5,000 pounds per square inch at a temperature of approximately 1,500 degrees centigrade, a face of said layer on said radially outer side having a roughness of from approximately 1 to 20 microns, said roughness being substantially formed by a dendritic growth of said refractory metal; and a structural carbon-composite shell tightly bonded to said face on said radially outer side of said layer.

7. A high temperature corrosion resistant composite structure comprising:

a generally circular refractory metallic layer having radially inner and radially outer sides, said radially outer side having a roughened surface having a roughness of from approximately 1 to 20 microns; and a refractory structural composite shell comprising a matrix and filamentaceous inclusions tightly bonded to said roughened surface, said refractory metallic layer being adapted to protect said refractory structural composite shell.

8. A high temperature corrosion resistant composite structure of claim 7 wherein said matrix comprises a ceramic.

9. A high temperature corrosion resistant composite structure of claim 7 wherein said matrix comprises carbon.

* * * * *